United States Patent

Jiang et al.

[11] Patent Number: 6,023,666
[45] Date of Patent: Feb. 8, 2000

[54] IN-LINE METHOD OF MONITORING DIE ATTACH MATERIAL ADHESIVE WEIGHT

[75] Inventors: Tongbi Jiang; John C. Fernandez, both of Boise, Id.

[73] Assignee: Micron Technology, Inc., Boise, Id.

[21] Appl. No.: 09/118,815

[22] Filed: Jul. 20, 1998

[51] Int. Cl.⁷ .................................................. B23K 31/12
[52] U.S. Cl. ........................ 702/173; 702/101; 702/174; 702/175
[58] Field of Search .................................. 702/173, 101, 702/102, 174, 175; 177/25.11, 25.12, 45, 46, 48, 52, 53, 58, 68, 1, 50; 324/528.4; 156/276, 60, 360, 349, 352, 378; 222/1, 52, 55

[56] References Cited

U.S. PATENT DOCUMENTS

| | | | |
|---|---|---|---|
| 4,550,793 | 11/1985 | Giles | 177/145 |
| 5,197,650 | 3/1993 | Monzen et al. | 228/6.2 |
| 5,321,634 | 6/1994 | Obata et al. | 364/563 |
| 5,662,763 | 9/1997 | Yamanaka | 156/358 |
| 5,832,600 | 11/1998 | Hashimoto | 29/841 |
| 5,857,589 | 1/1999 | Cline et al. | 222/1 |

*Primary Examiner*—Marc S. Hoff
*Assistant Examiner*—Hien Vo
*Attorney, Agent, or Firm*—Dickstein Shapiro Morin & Oshinsky LLP

[57] ABSTRACT

A method and apparatus for monitoring the die attach material adhesive weight in an in-line manner is disclosed. The method and apparatus utilize two weight platforms at pre-dispense and post-dispense positions of an assembly line carrying lead frames. The two platforms weigh the lead frames to obtain pre-dispense and post-dispense weight measurements. These measurements are used by a logic circuit to calculate the weight of the adhesive. The logic circuit upon detection of an inappropriate adhesive weight can sound an alarm, stop the assembly line or automatically adjust a dispenser to administer the appropriate amount of adhesive.

85 Claims, 5 Drawing Sheets

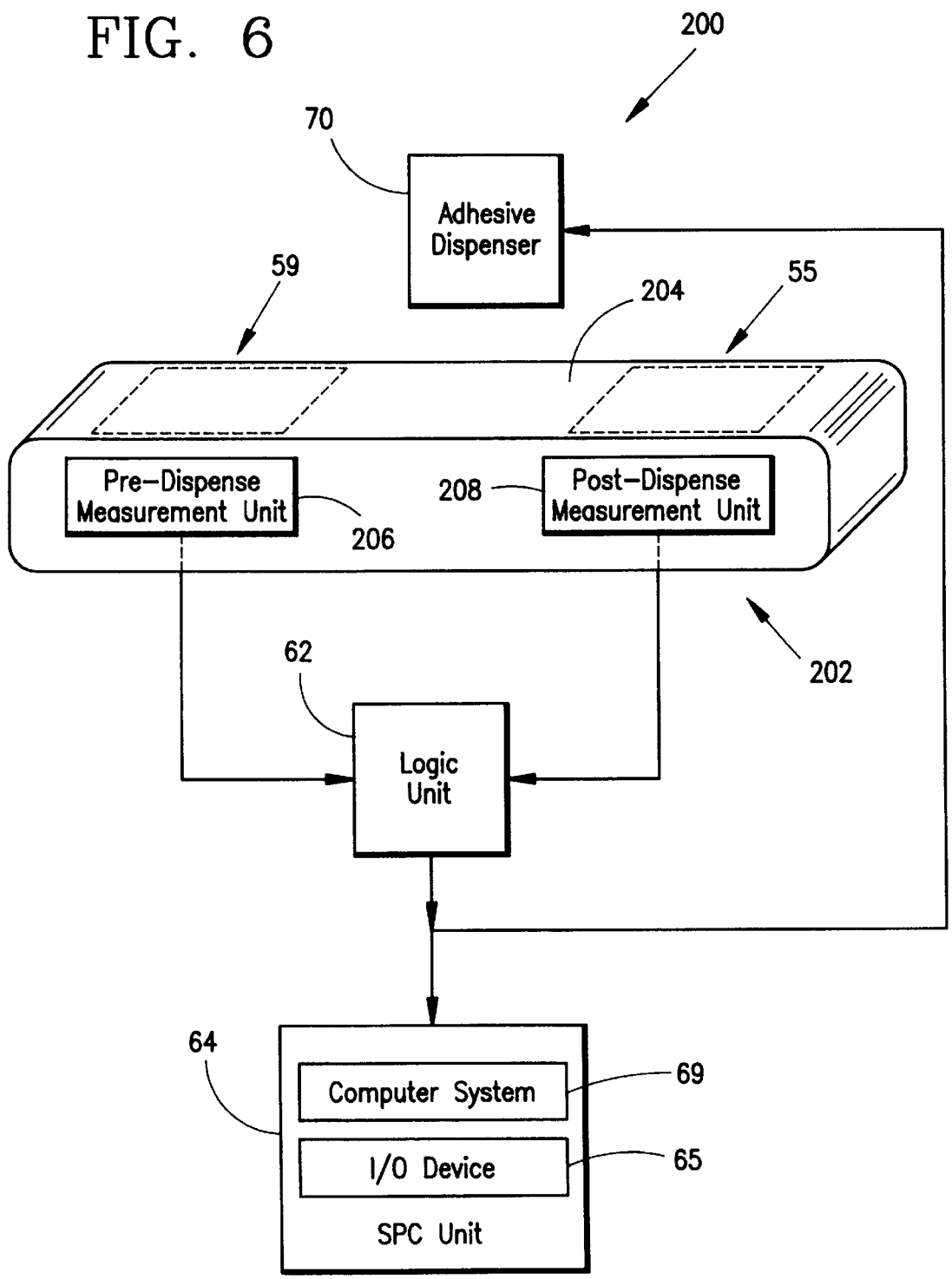

6,023,666

IN-LINE METHOD OF MONITORING DIE ATTACH MATERIAL ADHESIVE WEIGHT

BACKGROUND OF THE INVENTION

1. Field of the Invention

This invention relates to the field of semiconductor manufacture and, in particular, to an in-line method of monitoring die attach material adhesive weight.

2. Description of the Related Art

Various types of semiconductor devices are manufactured in much the same way. A starting substrate, usually a thin wafer of silicon or gallium arsenide, is masked, etched, and doped through several process steps. For each wafer produced, this process yields a number of die on the wafer. The die are separated with a die saw, and then packaged into individual components.

During the manufacturing process, several die are attached to a support element, often with a material such as epoxy or other viscous adhesives. The support element can be metal, ceramic, organic or any other support element used in electronic applications. A typical example of such a support element is a lead frame. For purposes of illustration only, a lead frame will be used as the support element. Wires are connected from the bond pads on each of the die to the "fingers" on the lead frame, then the die is encapsulated in a protective plastic casing. The plastic packages are separated, and the leads are formed into a desired shape. These leads couple the die with the device into which the component is installed, thereby forming an input and output means between the die and the device.

The lead frame, part of which will eventually form the conductive leads of the components, contains a major surface to which the die is attached, called the "paddle." The die is normally bonded to the paddle with epoxy or another viscous adhesive, although thermoplastic, tape, or another materials are also used. FIG. 1 shows a lead frame 10 having die paddles 12 with die 14 attached. The adhesive used to attach the die 14 to the lead frame 10 is dispensed on the die paddle 12 area of the lead frame 10. The die 14 is then placed on the die paddle 12. The die 14 is placed on the uncured epoxy and held at a specific pressure by die attachment equipment having a surface contact tool or an edge contact only tool (collet). The die 14 is pressed down into the adhesive at a specific pressure by the tool and held in place long enough to ensure adhesion. The attach process requires a follow-on cure in a separate cure oven. FIG. 2 shows a die 14 properly attached to a lead frame 10 by an adhesive 20. FIG. 2 also illustrates one example of how the bond pads 15 are subsequently bonded to the lead frame 10 by wires 30 to form an electrical connection between the die 14 and the leads of the lead frame 10.

Many problems result from a nonuniformity in the thickness (the "bond line") or amount of the adhesive 20 bonding the die 14 to the paddle 12. The adhesive 20 is generally applied to the paddle 12 by an adhesive dispenser. Most dispensers use a short pulse of air (usually lasting a few milliseconds) maintained at a predefined pressure to apply the adhesive 20 to the paddle 12. Accordingly, one way to control the amount of adhesive 20 applied is by increasing or decreasing the length of the pulses. Longer pulse lengths lead to more adhesive 20 while shorter pulse lengths lead to less adhesive 20 being applied to the paddle 12. Another way to control the amount of adhesive 20 applied is by increasing or decreasing the pressure used to dispense the adhesive 20. Increasing the pressure leads to more adhesive 20 while decreasing the pressure leads to less adhesive 20 being dispensed from the dispenser.

If not enough adhesive 20 is applied to the die paddle 12 a good bond between the die 14 and lead frame 10 cannot be ensured because of voids in the adhesive 20 under the die 14. If too much adhesive 20 is applied, too much of the adhesive 20 will ooze out from under the die 14 (resin bleed) which can prevent a good coupling between the bond wire and the bond pad during the wire bonding process. Too much adhesive 20 can also lead to a contamination of the lead frame 10 as well as other manufacturing problems.

Since the weight of the adhesive 20 directly relates to the amount of adhesive 20 applied to the lead frame 10, one method of ensuring the uniformity of the amount of adhesive 20 applied to the lead frame 10 is to monitor the adhesive's 20 weight. To do so, the lead frame 10 is weighed prior to applying the adhesive 20 and then weighed again once the adhesive 20 has been applied to the paddles 12. This second measurement requires that the lead frame 10 to be removed from the assembly line which slows down the throughput of the manufacturing process. The difference in the two measurements is then compared to a predetermined desired weight range. If the calculated adhesive weight falls within the range, then a proper amount of adhesive 20 is being applied to the paddle 12. If the calculated adhesive weight falls outside of the range, then an improper amount of adhesive 20 is being applied to the paddle 12.

Although the above technique can properly detect when an improper amount of adhesive 20 is being applied to the paddles 12 of a lead frame 10, it still has some shortcomings. One problem is that the weight measurements, adhesive weight calculation and dispenser control adjustments (if required) are all performed manually by an operator. Accordingly, there is the potential for human error in any one or all of these steps. In addition, the manual monitoring process requires the operator to slow down the throughput of the manufacturing process since the lead frames 10 must be removed from the assembly line to measure the weight of the applied adhesive 20. Since the manual monitoring process slows down the assembly line throughput, the monitoring of the adhesive weight will not be performed often. Accordingly, more lead frames 10 with inappropriate amounts of adhesive 20 will be produced before any necessary adjustments are made to the dispenser.

Therefore, there is a need and desire for a method and apparatus for monitoring the die attach material adhesive weight that can be performed in-line (that is, without removing the lead frame 10 from the assembly line) and without the need for human intervention. In addition, there is a need and desire for a method and apparatus for monitoring the die attach material adhesive weight that can automatically adjust an adhesive dispenser to dispense an appropriate amount of adhesive.

BRIEF SUMMARY OF THE INVENTION

The present invention provides a method and apparatus for monitoring the die attach material adhesive weight that can be performed in-line and without the need for human intervention.

The present invention also provides a method and apparatus for monitoring the die attach material adhesive weight that can automatically adjust an adhesive dispenser to dispense an appropriate amount of adhesive.

The above features and advantages are achieved by providing two weight platforms at pre-dispense and post-dispense positions of an assembly line carrying lead frames. The two platforms weigh the lead frames to obtain pre-dispense and post-dispense weight measurements. These measurements are used by a logic circuit to calculate the weight of the adhesive. The logic circuit upon detection of an inappropriate adhesive weight can sound an alarm, stop the assembly line or automatically adjust a dispensing unit to administer the appropriate amount of adhesive.

BRIEF DESCRIPTION OF THE DRAWINGS

The foregoing and other advantages of the invention will become more apparent from the detailed description of the preferred embodiments of the invention given below with reference to the accompanying drawings in which:

FIG. 6 illustrates a system for monitoring the die attach material adhesive weight constructed in accordance with a second embodiment of the present invention.

DETAILED DESCRIPTION OF THE PREFERRED EMBODIMENTS

The present invention monitors the weight of an adhesive used to attach a die to a support element. The support element can be either metal, ceramic, organic or any other support element used in electronic applications. A lead frame is one example of such a support element. For purposes of illustration, the present invention will be described using a lead frame as the support element.

Figure 1:
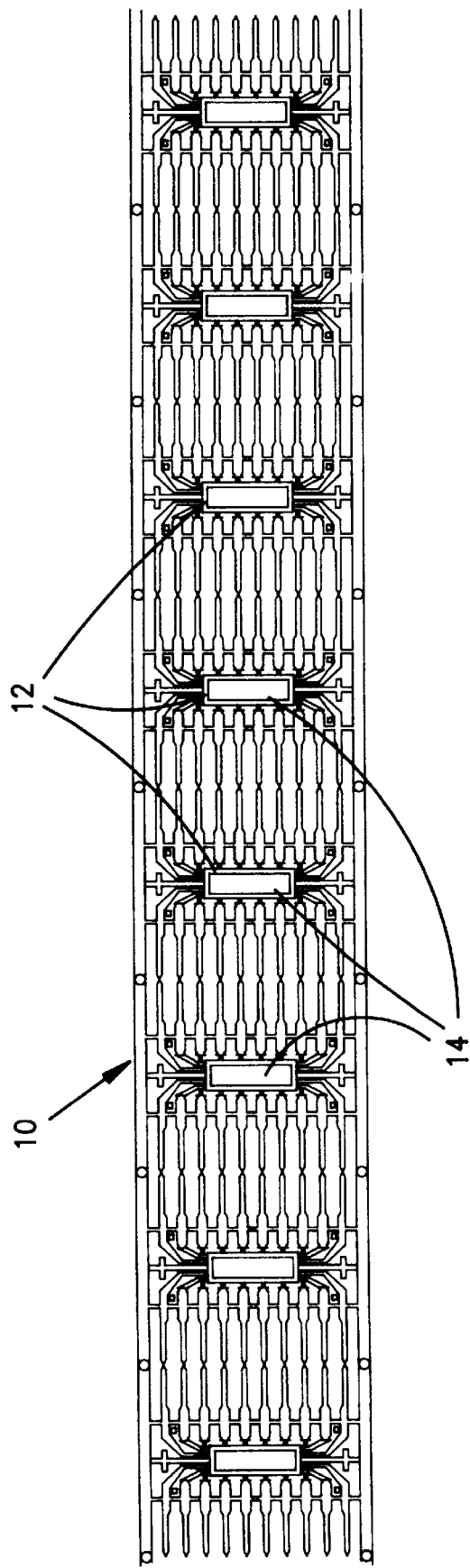
FIG. 1 is a top view of a lead frame having die paddles and semiconductor die attached.
Figure 2:
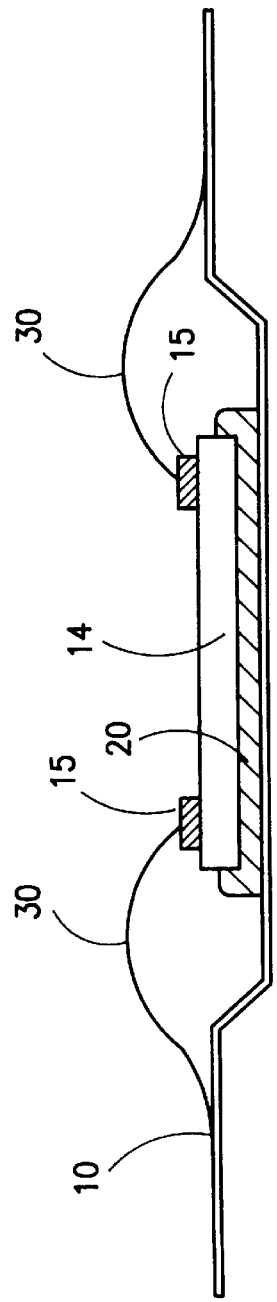
FIG. 2 is a cross sectional view of a semiconductor die attached to a lead frame with adhesive.
Figure 3:
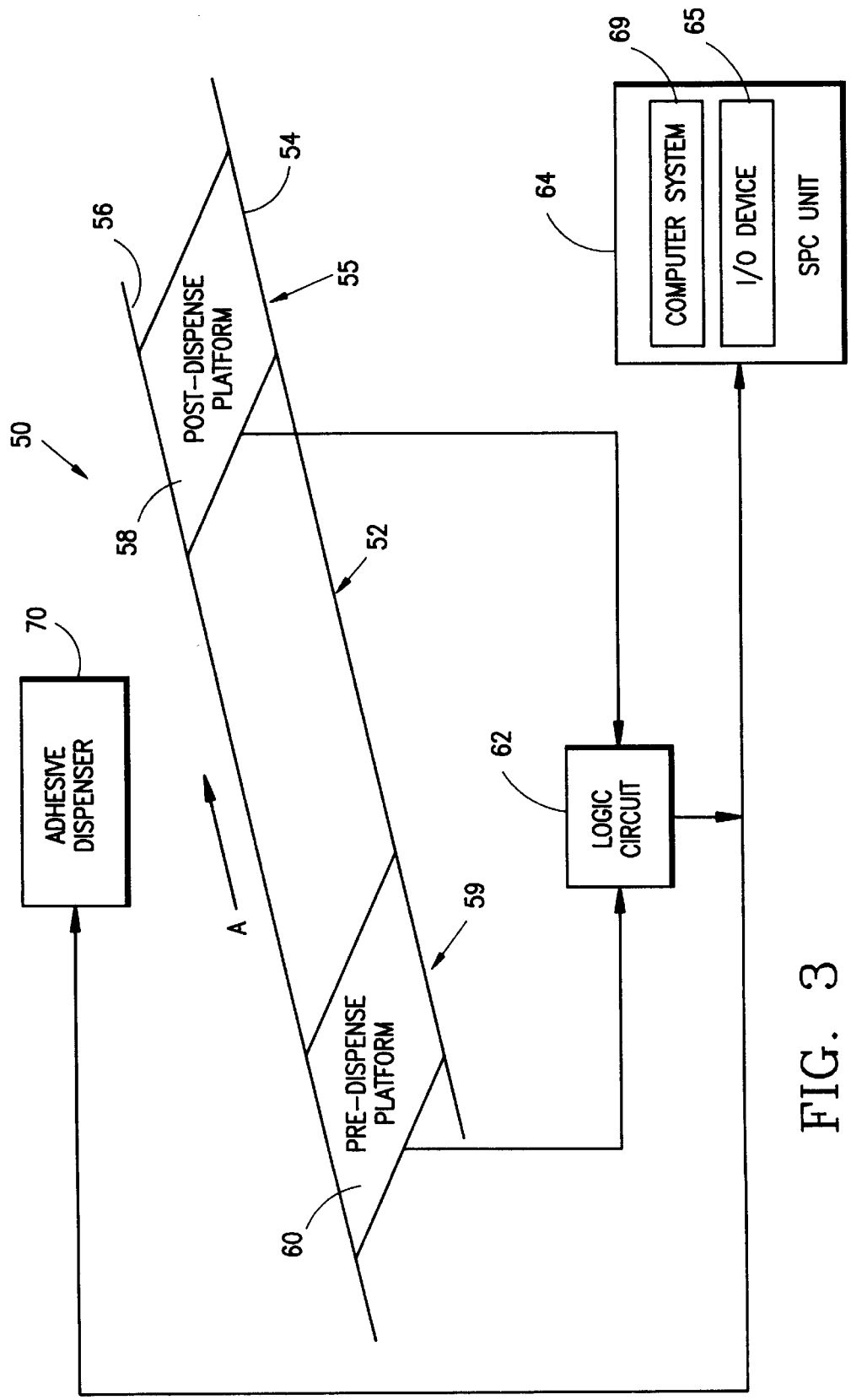
FIG. 3 illustrates a system for monitoring the die attach material adhesive weight constructed in accordance with a first embodiment of the present invention.

FIG. 3 illustrates a system 50 for monitoring the die attach material adhesive weight constructed in accordance with a first embodiment of the present invention. The system 50 includes an adhesive dispenser 70, a logic circuit 62 and an assembly line 52. The assembly line 52 includes two tracks 54, 56 for carrying lead frames from a pre-dispense location 59 (i.e., before the dispenser 70 applies adhesive to the lead frames) to a post-dispense location 55 (i.e., after the dispenser 70 applies adhesive to the lead frames). Located at the pre-dispense location 59 is a pre-dispense platform 60. Located at the post-dispense location 55 is a post-dispense platform 58. A logic circuit 62 is connected to and in communication with the pre-dispense platform 60, post bond platform 58, dispenser 70 and a statistical process control (SPC) unit 64.

As will be discussed below, the two platforms 60, 58 weigh lead frames to obtain pre-dispense and post-dispense weight measurements. These measurements are used by the logic circuit 62 to calculate the weight of the adhesive applied to the lead frame. The logic circuit 62 upon detection of an inappropriate adhesive weight can sound an alarm, stop the assembly line 52 or automatically adjust the dispenser 70 to administer the appropriate amount of adhesive.

Figure 4:
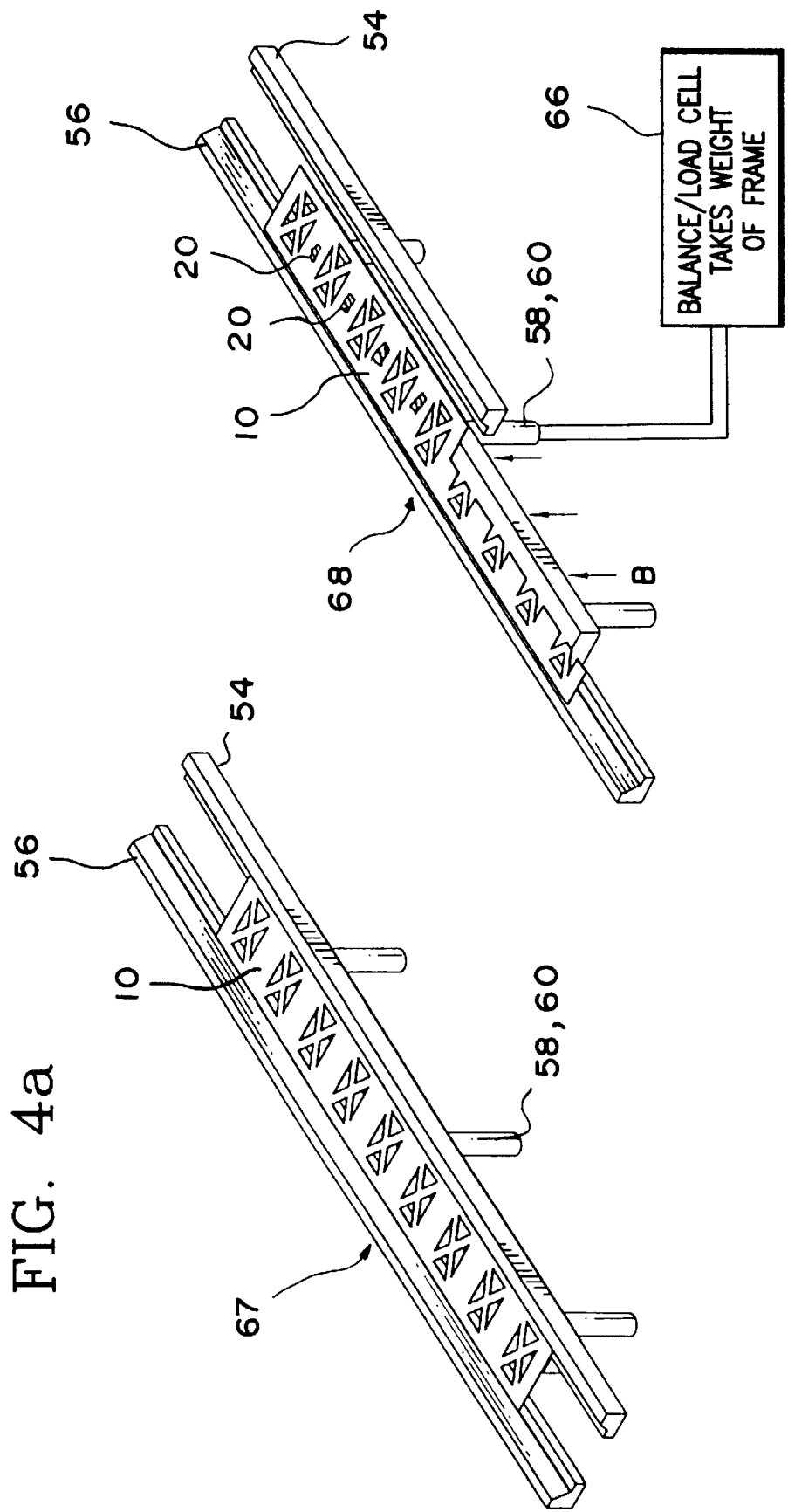
FIGS. 4a and 4b are detailed views of a weight platform used in the system illustrated in FIG. 3.

FIGS. 4a and 4b illustrate a detailed view of the pre-dispense and post-dispense platforms 58, 60. Preferably, the platforms 58, 60 are made from a conventional electronic balance or load cell 66 capable of measuring the weight of a lead frame 10 residing on the platforms 58, 60. As illustrated in FIGS. 4a and 4b, the platforms 58, 60 have a stationary position 67 and a weighing position 68. In the stationary position 67, the platforms 58 do not cause the load cell 66 to take a weight measurement. When the platforms 58, 60 are lifted (as shown by arrow "A") into the weighing position 68, the load cell 66 takes a weight measurement of the lead frame 10.

Referring again to FIG. 3, as the lead frames travel from the pre-dispense location 59 to the post-dispense location 55 (as shown by arrow "A") the two platforms 60, 58 measure the weight of the lead frames before and after the dispenser 70 applies adhesive to the frame as described above with reference to FIGS. 4a and 4b. Preferably, the measurements will be taken at a rate that ensures that the adhesive weight is being properly monitored without substantially impacting the throughput of the manufacturing process. It must be noted, however, that measurements can be made for every lead frame carried by the tracks 54, 56 if desired. The measurements from the pre-dispense platform 60 and the post-dispense platform 58 are input into the logic circuit 62.

Figure 5:
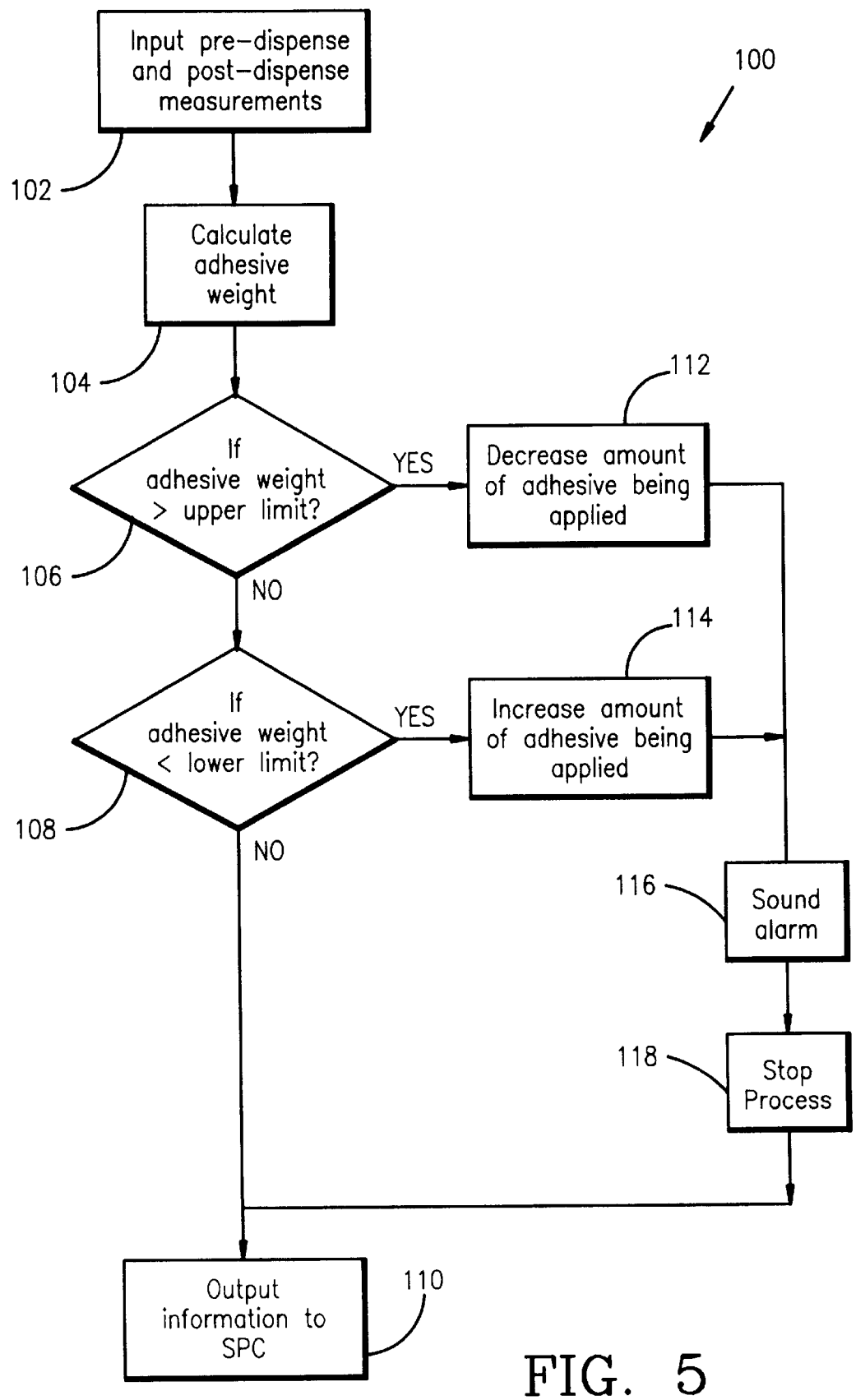
FIG. 5 illustrates the method of monitoring the die attach material adhesive weight performed by the system of FIG. 3.

FIG. 5 illustrates the method 100 performed by the logic circuit 62. In step 102, the logic circuit 62 receives the two measurements from the pre-dispense and post-dispense platforms 60, 58. In step 104, the logic circuit 62 calculates the weight of the adhesive by subtracting the pre-dispense measurement from the post-dispense measurement. The calculated adhesive weight is then compared to an upper limit value in step 106. This upper limit value represents the maximum weight the adhesive can have and still be considered appropriate for use in the die attach process. If the calculated adhesive weight is greater than the upper limit, then too much adhesive is being applied to the lead frames. If the calculated adhesive weight is less than the upper limit, then too much adhesive is not being applied to the lead frames.

If the calculated adhesive weight is greater than the upper limit, then too much adhesive is being applied to the lead frames and the method 100 continues at step 112. At this point, the logic circuit 62 can send a signal to the dispenser 70 to decrease the amount of adhesive being applied to the lead frames (step 112), sound an alarm indicating that the amount of adhesive is out of tolerance (step 116), send a signal to a controller of the assembly line 52 to stop the manufacturing process (step 118) or perform any combinations of these steps 112, 116, 118. As stated above, decreasing the amount of adhesive being used to attach the die to the lead frame is achieved by shortening the length of the pulses or decreasing the pressure used by the dispenser 70 to administer the adhesive. Accordingly, the signal sent by the logic circuit 62 to the dispenser 70 can trigger either a pressure change, a pulse length change or both to decrease the amount of adhesive being applied to the lead frame. After completing the desired steps 114, 116, 118, the method continues at step 110.

If the calculated adhesive weight is less than the upper limit (step 106), then too much adhesive is not being applied to the lead frames and the method continues at step 108 where the calculated adhesive weight is compared to a lower limit value. This lower limit value represents the minimum weight the adhesive can have and still be considered appropriate for use in the die attach process. If the calculated adhesive weight is less than the lower limit, then too little adhesive is being applied to the lead frames. If the calculated adhesive weight is greater than the lower limit, then an appropriate amount of adhesive is being applied to the lead frames and the method continues at step 110.

If the calculated adhesive weight is less than the lower limit, then too little adhesive is being applied to the lead frames and the method 100 continues at step 114. At this point, the logic circuit 62 can send a signal to the dispenser 70 to increase the amount of adhesive being applied to the lead frames (step 114), sound an alarm indicating that the amount of adhesive is out of tolerance (step 116), send a signal to a controller of the assembly line 52 to stop the manufacturing process (step 118) or perform any combinations of these steps 112, 116, 118. As stated above, increasing the amount of adhesive being used to attach the die to the lead frame is achieved by increasing the length of the pulses or increasing the pressure used by the dispenser 70 to administer the adhesive. Accordingly, the signal sent by the logic circuit 62 to the dispenser 70 can trigger either a pressure change, a pulse length change or both to increase the amount of adhesive being applied to the lead frame. After completing the desired steps 114, 116, 118, the method continues at step 110.

At step 110, the logic circuit 62 outputs the calculated adhesive weight to the SPC unit 64. The logic circuit 62 can also output the two weight measurements from the pre-dispense and post-dispense platforms 60, 58, the upper limit value and the lower limit value if so desired. The SPC unit 64 can include an input/output device 65 such as a display or it can be a computer system 69 having display and storage devices. The SPC unit 64 is used to display the adhesive weight and can also be used to show where this weight lies within the upper and lower limits values. If a computer system 69 is included in the SPC unit 64, the unit 64 can be used to store the information received by the logic unit 62. The stored information can then be used to monitor the consistency of the adhesive weight from one measurement to another within the same "lot" of manufactured semiconductor devices. In addition, the SPC unit 64 can be used to determine the consistency of the die attach process between different lots of manufactured semiconductor devices.

FIG. 6 illustrates a system 200 for monitoring the die attach material adhesive weight constructed in accordance with a second embodiment of the present invention. In the following description similar components used in both system 200 and system 50 (FIG. 3) are referred to by the same reference numeral. The system 200 includes an adhesive dispenser 70, a logic circuit 62 and an assembly line 202. The assembly line 202 includes a conveyor belt 204 for carrying lead frames from a pre-dispense location 59 (i.e., before the dispenser 70 applies adhesive to the lead frames) to a post-dispense location 55 (i.e., after the dispenser 70 applies adhesive to the lead frames). Located at the pre-dispense location 59 and underneath the belt 204 is a pre-dispense measuring unit. Located at the post-dispense location 55 and underneath the belt 204 is a post-dispense measuring unit 58. A logic circuit 62 is connected to and in communication with the pre-dispense measuring unit, post-dispense measuring unit 208, dispenser 70 and a statistical process control (SPC) unit 64.

The operation of the system 200 is essentially the same as the system 50 described with reference to FIG. 3. The major difference between the two systems 50, 200 is that the system 200 constructed in accordance with the second embodiment of the present invention utilizes an assembly line 202 containing two weight measuring units 206, 208 located underneath a conveyor belt 204. Preferably, the units 206, 208 are made from a conventional electronic balance or load cell capable of measuring the weight of a lead frame traveling along the belt 204. Unlike the platforms 58, 60 used in the first embodiment (illustrated in FIGS. 4a and 4b), the units 206, 208 simply take a weight measurement of the lead frame as it passes over the pre-dispense and post-dispense locations 59, 55 without liffing up a platform 58, 60 to obtain pre-dispense and post-dispense weight measurements. As described above with reference to FIG. 3, these measurements are used by the logic circuit 62 to calculate the weight of the adhesive applied to the lead frame. The logic circuit 62 upon detection of an inappropriate adhesive weight can sound an alarm, stop the assembly line 52 or automatically adjust the dispenser 70 to administer the appropriate amount of adhesive.

It must be noted that either embodiment of the present invention can be used to detect additional errors that arise during the die attach process. A reference weight for a typical lead frame can be created by weighing one lead frame prior to the automatic operation of the manufacturing process. This reference weight can then be used by the present invention to detect abnormally large pre-dispense weight measurements. Double framing, (i.e., where two or more lead frames are inadvertently stacked on top of each other while undergoing the die attach process), for example, can be detected by comparing the pre-dispense measurement to the reference weight. A large discrepancy between the pre-dispense and reference weights indicates that there is a problem such as double framing. In addition, the reference weight can also be used as the pre-dispense measurement dispensing with the need for a pre-dispense platform 60 or pre-dispense measuring unit 206.

It must be noted that either embodiment of the present invention can obtain a post-dispense measurement after the die has been attached to the lead frame. A reference weight for the die to be attached to the lead frame can be created by weighing one die prior to the automatic operation of the manufacturing process. This die reference weight can then be subtracted from a post-dispense measurement that has been taken after the die has been attached to the lead frame. That is, the adhesive weight will be the second weight measurement minus the first weight measurement (or the lead frame reference weight) and the die reference weight.

It must be noted that either embodiment of the present invention can obtain pre-dispense and post-dispense measurements at the same location along the assembly line 52 (FIG. 3), 204 (FIG. 6). That is, the pre-dispense measurement is taken, the adhesive is applied to the lead frame, and the post-dispense measurement is taken at one location and with the same measurement device. This dispenses with the need for separate pre-dispense and post-dispense locations and measurement devices.

It must be noted that the logic circuit 62 may a general purpose computer programmed to carry out the method 100 discussed above with reference to FIG. 5. However, it should be understood that one or more of the operations described may also be carried out in an equivalent manner by a special purpose computer or hardware circuits. Thus, one or more portions of the logic circuit 62 may be performed with hardware, firmware, software or any combination of these. In addition, it must be noted that the SPC unit 64 can also be used to control the dispenser 70 by the method 100 illustrated in FIG. 5. It must also be noted, the either the logic circuit 62 or the SPC unit 64 can be used to send to the dispenser 70 the new pressure or pulse length values. Likewise, the logic circuit 62 or the SPC unit 64 can also be used to send to dispenser 70 the required change to pressure or pulse length values.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention.

What is claimed as new and desired to be protected by Letters Patent of the United States is:

1. A machine implemented in-line method of monitoring die attach material adhesive weight comprising the steps of:

taking a first weight measurement of a support element used in the manufacture of integrated circuits before an adhesive is applied to said support element;

taking a second weight measurement of said support element after said adhesive has been applied to said support element, said first and second weight measurement steps being performed as said support element travels along an assembly line and said first and second measurements being taken at different locations on said assembly line; and calculating a weight of said adhesive from a difference between said first and second weight measurements.

2. The method according to claim 1 further comprising the step of comparing said calculated adhesive weight to an upper limit.

3. The method according to claim 2 further comprising the step of providing an indication if said adhesive weight is greater than said upper limit.

4. The method according to claim 3 wherein said step of providing an indication includes sounding an alarm.

5. The method according to claim 2 further comprising the step of sending a control signal to an adhesive dispensing unit if said adhesive weight is greater than said upper limit, said adhesive dispensing unit decreasing an amount of said adhesive being applied to said support element in response to said control signal.

6. The method according to claim 5 wherein said adhesive dispensing unit decreases the amount of said adhesive by decreasing a pressure used to dispense said adhesive.

7. The method according to claim 5 wherein said adhesive dispensing unit decreases the amount of said adhesive by decreasing a pulse length used to dispense said adhesive.

8. The method according to claim 2 further comprising the step of stopping said assembly line if said adhesive weight is greater than said upper limit.

9. The method according to claim 1 further comprising the step of comparing said calculated adhesive weight to a lower limit.

10. The method according to claim 9 further comprising the step of providing an indication if said adhesive weight is less than said lower limit.

11. The method according to claim 10 wherein said step of providing an indication includes sounding an alarm.

12. The method according to claim 9 further comprising the step of sending a control signal to an adhesive dispensing unit if said adhesive weight is less than said lower limit, said adhesive dispensing unit increasing an amount of said adhesive being applied to said support element in response to said control signal.

13. The method according to claim 12 wherein said adhesive dispensing unit increases the amount of said adhesive by increasing a pressure used to dispense said adhesive.

14. The method according to claim 12 wherein said adhesive dispensing unit increases the amount of said adhesive by increasing a pulse length used to dispense said adhesive.

15. The method according to claim 9 further comprising the step of stopping said assembly line if said adhesive weight is less than said lower limit.

16. The method according to claim 1 further comprising the steps of:

providing a process control unit; and sending said adhesive weight to said process control unit.

17. The method according to claim 16 wherein said process control unit displays said adhesive weight.

18. The method according to claim 16 wherein said process control unit stores said adhesive weight on a computer readable medium.

19. The method according to claim 18 wherein said process control unit compares said calculated adhesive weight to an upper limit.

20. The method according to claim 19 wherein said process control unit provides an indication if said adhesive weight is greater than said upper limit.

21. The method according to claim 20 wherein said step of providing an indication includes sounding an alarm.

22. The method according to claim 16 wherein said process control unit compares said calculated adhesive weight to a lower limit.

23. The method according to claim 22 wherein said process control unit provides an indication if said adhesive weight is less than said lower limit.

24. The method according to claim 22 wherein said step of providing an indication includes sounding an alarm.

25. The method according to claim 1 wherein said second weight measurement is taken after a die is attached to said support element, said die having a known weight measurement, wherein said adhesive weight is calculated from a difference between said first, second and known die weight measurements.

26. The method according to claim 1 wherein said support element is a metal support element.

27. The method according to claim 1 wherein said support element is a ceramic support element.

28. The method according to claim 1 wherein said support element is an organic support element.

29. The method according to claim 1 wherein said support element is a lead frame.

30. A method of producing a system for monitoring die attach material adhesive weight comprising the steps of:

providing a first measurement unit for taking a first weight measurement of a support element used in the manufacture of integrated circuits before an adhesive is applied to said support element, said first measurement unit being provided within an assembly line such that said first measurement is taken as said support element travels along said assembly line;

providing a second measurement unit for taking a second weight measurement of said support element after said adhesive is applied to said support element, said second measurement unit being provided within said assembly line such that said second measurement is taken at a location different from a location of said first measurement unit; and providing a logic circuit for calculating a weight of said adhesive based on a difference between said first and second weight measurements.

31. The method according to claim 30 further comprising the step of providing a process control unit connected to and in communication with said logic circuit, wherein said logic circuit sends said adhesive weight to said process control unit.

32. The method according to claim 30 further comprising the step of connecting said logic circuit to an adhesive dispensing unit, said logic circuit providing a control signal to said dispensing unit when said adhesive weight is greater than an upper limit or less than a lower limit, wherein said dispensing unit adjusts an amount of adhesive being applied to a support element in response to said control signal.

33. The method according to claim 30 wherein said support element is a metal support element.

34. The method according to claim 30 wherein said support element is a ceramic support element.

35. The method according to claim 30 wherein said support element is an organic support element.

36. The method according to claim 30 wherein said support element is a lead frame.

37. An apparatus for monitoring die attach material adhesive weight comprising:
a first measurement unit for taking a first weight measurement of a support element used in the manufacture of integrated circuits before an adhesive is applied to said support element, said first measurement unit being provided within an assembly line such that said first weight measurement is taken as said support element travels along said assembly line;
a second measurement unit for taking a second weight measurement of said support element after an adhesive is applied to said support element, said second measurement unit being provided within said assembly line such that said second weight measurement is taken at a location different from a location of said first measurement unit; and
a logic circuit connected to and in communication with said measurement units, said logic circuit for calculating a weight of said adhesive from a difference between said first and second weight measurements.

38. The apparatus according to claim 37 wherein said measurement units are electronic balances.

39. The apparatus according to claim 37 wherein said measurement units are load cells.

40. The apparatus according to claim 37 wherein said measurement units are contained within a weight platform.

41. The apparatus according to claim 37 wherein said assembly line includes a conveyor belt and said measurement units are located underneath said conveyor belt.

42. The apparatus according to claim 37 wherein said logic circuit compares said adhesive weight to an upper limit, said logic circuit generating a control signal if said adhesive weight is greater than said upper limit, said control signal for controlling an adhesive dispensing unit.

43. The apparatus according to claim 37 wherein said logic circuit compares said adhesive weight to a lower limit, said logic circuit generating a control signal if said adhesive weight is less than said lower limit, for controlling an adhesive dispensing unit.

44. The apparatus according to claim 37 wherein said logic circuit compares said adhesive weight to an upper limit, said logic circuit providing an indication if said adhesive weight is greater than said upper limit.

45. The apparatus according to claim 44 wherein said indication provided by said logic circuit includes an alarm.

46. The apparatus according to claim 37 wherein said logic circuit compares said adhesive weight to a lower limit, said logic circuit providing an indication if said adhesive weight is less than said lower limit.

47. The apparatus according to claim 46 wherein said indication provided by said logic circuit includes an alarm.

48. The apparatus according to claim 37 wherein said second weight measurement unit takes said second weight measurement after a die is attached to said support element, said die having a known weight measurement, wherein said adhesive weight is calculated from a difference between said first and second weight measurements and said known die weight measurement.

49. The apparatus according to claim 37 wherein said support element is a metal support element.

50. The apparatus according to claim 37 wherein said support element is a ceramic support element.

51. The apparatus according to claim 37 wherein said support element is an organic support element.

52. The apparatus according to claim 37 wherein said support element is a lead frame.

53. A system for monitoring die attach material adhesive weight comprising:
an adhesive dispensing unit for applying adhesive to a support element used in the manufacture of integrated circuits;
a first measurement unit for taking a first weight measurement of said support element before an adhesive is applied to said support element, said first measurement unit being provided within an assembly line such that said first weight measurement is taken as said support element travels along said assembly line;
a second measurement unit for taking a second weight measurement of said support element after an adhesive is applied to said support element, said second measurement unit being provided within said assembly line such that said second weight measurement is taken at a location different from a location of said first measurement unit; and
a logic circuit connected to and in communication with said measurement units and said dispensing unit, said logic circuit calculating a weight of said adhesive from a difference between said weight measurements.

54. The system according to claim 53 wherein said first and second measurement units are electronic balances.

55. The system according to claim 53 wherein said first and second measurement units are load cells.

56. The system according to claim 53 wherein said first and second measurement unit are respectively contained within first and second weight platforms.

57. The system according to claim 53 wherein said assembly line includes a conveyor belt and said first and second measurement units are located underneath said conveyor belt.

58. The system according to claim 53 wherein said logic circuit compares said adhesive weight to an upper limit, said logic circuit generating a control signal if said adhesive weight is greater than said upper limit, said control signal controlling said adhesive dispensing unit.

59. The system according to claim 58 wherein said dispensing unit decreases an amount of said adhesive applied to said support element in response to said control signal.

60. The system according to claim 59 wherein said dispensing unit decreases the amount of said adhesive by decreasing a pressure used to dispense said adhesive.

61. The system according to claim 59 wherein said adhesive dispensing unit decreases the amount of said adhesive by decreasing a pulse length used to dispense said adhesive.

62. The system according to claim 53 wherein said logic circuit compares said adhesive weight to an upper limit, said logic circuit providing an indication if said adhesive weight is greater than said upper limit.

63. The system according to claim 62 wherein said indication provided by said logic circuit includes an alarm.

64. The system according to claim 53 wherein said logic circuit compares said adhesive weight to an upper limit, said logic circuit stops said assembly line if said adhesive weight is greater than said upper limit.

65. The system according to claim 53 wherein said logic circuit compares said adhesive weight to a lower limit, said logic circuit generating a control signal if said adhesive weight is less than said lower limit, said control signal controlling said adhesive dispensing unit.

66. The system according to claim 65 wherein said dispensing unit increases an amount of said adhesive applied to said support element in response to said control signal.

67. The system according to claim 66 wherein said dispensing unit increases the amount of said adhesive by increasing a pressure used to dispense said adhesive.

68. The system according to claim 66 wherein said adhesive dispensing unit increases the amount of said adhesive by increasing a pulse length used to dispense said adhesive.

69. The system according to claim 53 wherein said logic circuit compares said adhesive weight to a lower limit, said logic circuit providing an indication if said adhesive weight is less than said lower limit.

70. The system according to claim 69 wherein said indication provided by said logic circuit includes an alarm.

71. The system according to claim 53 wherein said logic circuit compares said adhesive weight to a lower limit, said logic circuit stops said assembly line if said adhesive weight is less than said upper limit.

72. The system according to claim 53 further comprising a process control unit connected to an in communication with said logic circuit, wherein said logic circuit sends said adhesive weight to said process control unit.

73. The system according to claim 72 wherein said process control unit displays said adhesive weight.

74. The system according to claim 72 wherein said process control unit stores said adhesive weight on a computer readable medium.

75. The system according to claim 72 wherein said process control unit compares said calculated adhesive weight to an upper limit.

76. The system according to claim 75 wherein said process control unit provides an indication if said adhesive weight is greater than said upper limit.

77. The system according to claim 76 wherein said indication provided by said process control unit includes an alarm.

78. The system according to claim 72 wherein said process control unit compares said calculated adhesive weight to a lower limit.

79. The system according to claim 78 wherein said process control unit provides an indication if said adhesive weight is less than said lower limit.

80. The system according to claim 79 wherein said indication provided by said process control unit includes an alarm.

81. The system according to claim 53 wherein said second weight measurement is taken after a die is attached to said support element, said die having a known weight measurement, wherein said adhesive weight is calculated from a difference between said first, second and known die weight measurements.

82. The system according to claim 53 wherein said support element is a metal support element.

83. The system according to claim 53 wherein said support element is a ceramic support element.

84. The system according to claim 53 wherein said support element is an organic support element.

85. The system according to claim 53 wherein said support element is a lead frame.

* * * * *